United States Patent [19]

Koshizuka et al.

[11] Patent Number: 4,800,552
[45] Date of Patent: Jan. 24, 1989

[54] SEMICONDUCTOR MEMORY DEVICE WITH RESET SIGNAL GENERATING CIRCUIT

[75] Inventors: Atuo Koshizuka, Kawasaki; Kazuto Furumochi, Yokohama, both of Japan

[73] Assignee: Fujitsu Limited, Kawasaki, Japan

[21] Appl. No.: 941,437

[22] Filed: Dec. 15, 1986

[30] Foreign Application Priority Data

Dec. 18, 1985 [JP] Japan .................................. 60-282736
Dec. 19, 1985 [JP] Japan .................................. 60-284406

[51] Int. Cl.$^4$ .......................... G11C 7/00; G11C 8/00
[52] U.S. Cl. .................................... 365/190; 365/202; 365/230
[58] Field of Search ............... 365/174, 189, 190, 230, 365/233, 202, 203

[56] References Cited

U.S. PATENT DOCUMENTS 4,616,344 10/1986 Noguchi et al. ...................... 365/203
4,656,608 4/1987 Aoyama .............................. 365/203

Primary Examiner—Terrell W. Fears
Assistant Examiner—Melissa J. Koval
Attorney, Agent, or Firm—Staas & Halsey

[57] ABSTRACT

A semiconductor memory device includes a reset circuit for equalizing potentials of a pair of signal lines for transferring a complementary signal, and a clock generating circuit generating a first clock signal and a second clock signal at a time different from the generation of the first clock. A logical OR gate circuit generates a reset signal based on the first and second clock signals.

When the pulse width of an active low chip selection signal is shorter than a predetermined time period, the pulse width of the reset signal is made longer than that generated when the pulse width of the signal is longer than the predetermined time period. As a result, the potentials of a pair of complementary bit lines connected to each cell in the memory cell array can be reliably reset, and the delay time in the access operation can be reduced.

8 Claims, 7 Drawing Sheets

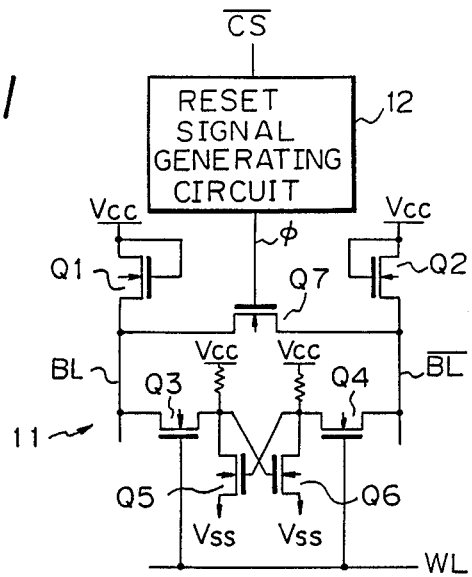
Fig. 1
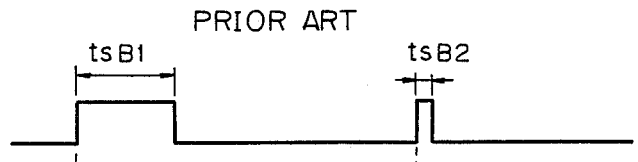
PRIOR ART
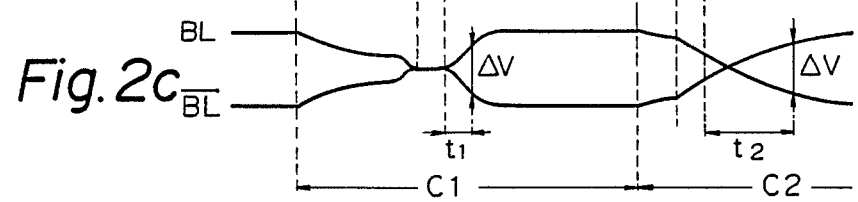
Fig. 2a $\overline{CS}$
Fig. 2b $\phi$
Fig. 2c BL / $\overline{BL}$

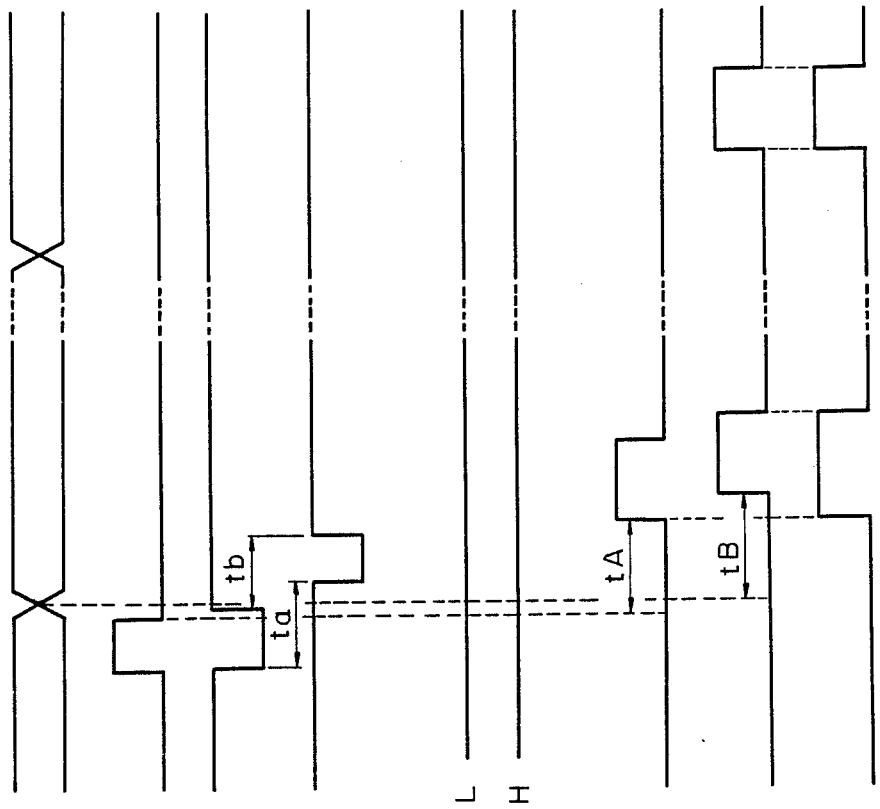

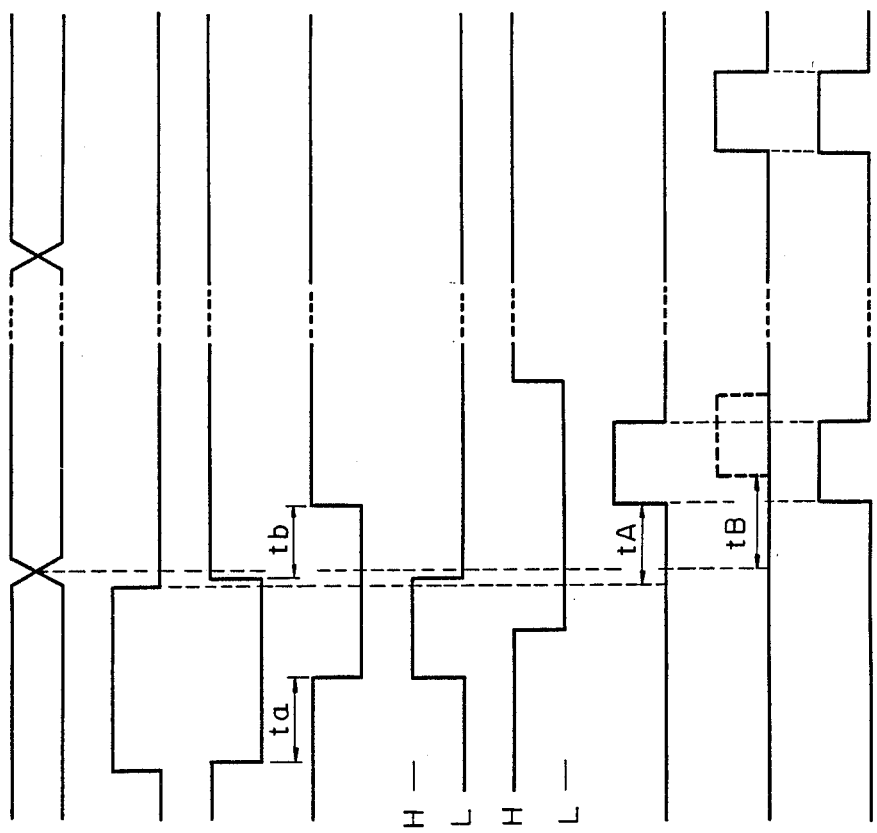

SEMICONDUCTOR MEMORY DEVICE WITH RESET SIGNAL GENERATING CIRCUIT

BACKGROUND OF THE INVENTION

1. Field of the Invention

The present invention relates to a semiconductor memory device and, more particularly, to a semiconductor memory device with a circuit generating a reset signal for equalizing the potentials of a pair of complementary bit lines connected to a static type random access memory (SRAM) cell. The device according to the present invention is used, for example, in an information system of a computer, an electronic apparatus, and the like.

2. Description of the Related Art

In a conventional semiconductor memory device, to reduce access time, i.e., a time taken to read data from a memory cell, a technique of equalizing the potentials of a pair of signal lines for transferring the complementary signal, for example a pair of bit lines, or a pair of data bus lines, connected to the memory cell in the non-selection state of the chip has been employed. In this case, the potentials of the pair of bit lines or data bus lines must be reliably reset or equalized irrespective of the length of the pulse width of an active low chip selection signal, which will be hereinafter referred to as a chip non-selection signal. In the known device, however, reset signals having a constant pulse width are generated in response to a change of the chip non-selection signal from high level to low level, irrespective of the length of the pulse width of the chip non-selection signal. Accordingly, where the pulse width of the chip non-selection signal is short, a serious problem arises in that the potentials of the pair of bit lines cannot be fully reset, and thus it takes a long time for the memory cell to reach the stand-by state, resulting in an increase of the access time.

On the other hand, to decrease the currents dissipated during the stand-by period of the memory cell, usually a switching transistor controlled by the chip non-selection signal is inserted into a circuit portion, where a steady direct current flows, of a decoder circuit and the like in the device, to bring the direct currents dissipated during the stand-by period to zero volt. As a result, the currents dissipated during the stand-by period can be decreased, and consist only of the very small currents which flow through load resistors in the memory cell. However, in a system using many such SRAM devices, a structure is often employed wherein address terminals of each SRAM device are connected to a common address bus and a desired SRAM device is selected through control of the chip non-selection signal. In this system, taking into consideration each of the SRAM devices, input signals to address signal terminals are changed during the stand-by period. As is well known, in a complementary metal oxide semiconductor (CMOS) circuit, the currents dissipated in the steady state are extremely small, but the currents dissipated when the input signal is changed at a high speed are considerably large. Thus, in the system of the above-mentioned structure, the currents dissipated in a first stage CMOS circuit having an input connected to address signal input terminals and a subsequent CMOS buffer circuit driven by the first stage CMOS circuit can become considerably large. Particularly, in an extremely large capacity SRAM device having a large number of address input terminals and a corresponding number of circuits, the currents dissipated in the entire first stage circuit and subsequent buffer circuit, which continually respond to the change of address, are extremely large, in contrast to the total currents dissipated during the stand-by period. To cope with this problem, the technique of chip selection (CS) first stage control has been heretofore employed.

In an example of the related art device using this CS first stage control, a CS buffer and an address buffer are provided, and the change of address signal is not transmitted to an internal circuit following the address buffer and including memory cells, so that the power dissipation can be decreased. However, when such a CS first stage control is effected, inevitably a delay occurs in the CS buffer, from the time when the chip non-selection signal is input, to the time when the address buffer is controlled.

Therefore, in the semiconductor memory device using the above-mentioned CS first stage control, when the pulse width of the chip non-selection signal is short, the potentials of the pair of bit lines cannot be fully reset, and thus it takes a long time for the memory cell to reach the stand-by state, and further, the delay time due to the CS first stage control is added thereto, resulting in a disadvantageous access operation, particularly in an access operation in a high speed SRAM device.

SUMMARY OF THE INVENTION

An object of the present invention is to provide a semiconductor memory device which, irrespective of the length of the pulse width of a chip non-selection signal, enables a reset of the potentials of a pair of bit lines to be reliably effected, thereby preventing delay in an access operation.

Another object of the present invention is to provide a semiconductor memory device which can prevent delay in the access operation even when a CS first stage control is effected.

The above-mentioned objects are attained by providing a semiconductor memory device having a chip selection state and a chip non-selection state and receiving an address signal and a chip selection signal, the device comprising: a pair of signal lines for transferring a complementary signal; reset means operatively connected between said signal lines for equalizing potentials of the signal lines in response to a reset signal; a first clock generating circuit for generating a first clock signal in response to a transition of the chip selection signal; a second clock generating circuit for generating a second clock signal in response to a transition of the address signal; a logical OR circuit receiving the first and second clock signals and outputting the reset signal; and a control circuit operatively connected to the second clock generating circuit for permitting a generation of the second clock signal after a transition from the chip non-selection state having a time period shorter than a first predetermined time period to the chip selection state.

BRIEF DESCRIPTION OF THE DRAWINGS

Other objects and features of the present invention will be described hereinafter in detail by way of a preferred embodiment with reference to the accompanying drawings, in which;

FIG. 1 is a circuit diagram illustrating an example of a semiconductor memory device with a reset signal generating circuit;

FIGS. 2a to 2c are waveform diagrams according to the prior art, for explaining the operation of the device shown in FIG. 1;

FIGS. 8a to 8i are waveform diagrams for explaining the operation of the device shown in FIG. 3, under the condition that the pulse width of a chip non-selection signal ($\overline{CS}$) is shorter than the predetermined time period; and FIGS. 9a to 9i are waveform diagrams corresponding to FIGS. 8a to 8i, but under the condition that the pulse width of a chip non-selection signal ($\overline{CS}$) is longer than the predetermined time period.

DESCRIPTION OF THE PREFERRED EMBODIMENTS

Figure 3:
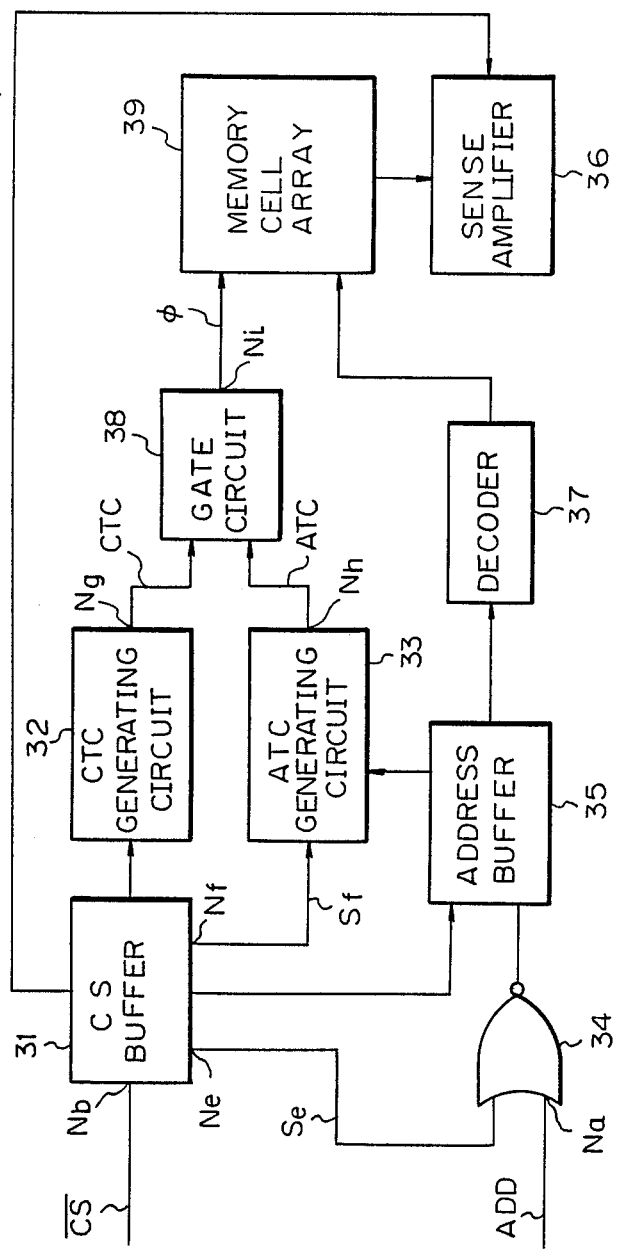
FIG. 3 is a block diagram illustrating a semiconductor memory device with a reset signal generating circuit as an embodiment of the present invention.

For a better understanding of the preferred embodiment, the problems of the prior art will now be explained with reference to FIG. 1 and FIGS. 2a to 2c.

FIG. 1 shows an example of a semiconductor memory device with a reset signal generating circuit. In FIG. 1, reference numeral 11 denotes a SRAM which is part of a memory cell array (not shown). In the SRAM 11, Q1 and Q2 denote load transistors for bit lines BL and $\overline{BL}$, respectively; Q3 and Q4 denote transfer gate transistors turned ON and OFF by the potential of a word line WL; Q5 and Q6 denote transistors constituting a flip-flop in the memory cell; and Q7 denotes a resetting transistor for equalizing the potentials of bit lines BL and $\overline{BL}$ by short-circuiting therebetween in response to a reset signal $\phi$. Reference numeral 12 denotes a reset signal generating circuit, which generates the reset signal $\phi$ in response to a chip non-selection signal $\overline{CS}$ input, and is a conventional known circuit.

For explaining the operation of the device shown in FIG. 1, waveform diagrams according to the prior art are illustrated in FIGS. 2a to 2c, in which reference marks C1 and C2 denote read cycles. In the read cycle C1, a chip non-selection signal $\overline{CS}$ having a sufficiently long pulse width is given, but in the read cycle C2, a chip non-selection signal $\overline{CS}$ having a relatively short pulse width is given. As shown in FIG. 2b, according to the prior art operation, the reset signals $\phi$ have a constant pulse width and are generated in response to a change of the chip non-selection signal $\overline{CS}$ from high level to low level, irrespective of the length of the pulse width of the signal $\overline{CS}$.

Accordingly, in the read cycle C1 in which the chip non-selection signal CS having a sufficiently long pulse width is given, the memory cells reach the stand-by state due to the long stand-by period tSB1, and thus the potential difference between the bit lines BL and $\overline{BL}$ is small enough for a reliable resetting to be effected. As a result, the potential difference $\Delta V$ required for the read-out of the data is obtained between the bit lines BL and $\overline{BL}$ in a relatively short period t1, as shown in FIG. 2c.

In the read cycle C2, however, in which the chip non-selection signal $\overline{CS}$ having a relatively short pulse width is given, the memory cells do not reach the stand-by state due to the short stand-by period tSB2, and thus the potential difference between the bit lines BL and $\overline{BL}$ at the rise of the reset signal $\phi$ does not become small enough for the resetting to be effected. Accordingly, because the reset signal $\phi$ has a short pulse width, the potentials of the bit lines BL and $\overline{BL}$ cannot be equalized (reset), and as a result, the potential difference $\Delta V$ required for a data read-out is obtained between the bit lines BL and $\overline{BL}$ in a considerably long period t2, as shown in FIG. 2c. This leads to a delay in the access operation.

A preferred embodiment of the present invention will now be described in detail with reference to FIGS. 3 through 9a to 9i.

FIG. 3 illustrates a block diagram of a semiconductor memory device with a reset signal generating circuit as an embodiment of the present invention. In FIG. 3, reference numeral 31 denotes a chip selection (CS) buffer, which is connected to a CTC generating circuit 32, a ATC generating circuit 33, one input of a NOR gate 34, an address buffer 35, and a sense amplifier 36 for reading data from a memory cell array 39. CTC and ATC denote a clock based on the change of a chip selection signal CS or chip non-selection signal $\overline{CS}$ and a clock based on the change of an address signal ADD, respectively. The CS buffer 31 receives the chip non-selection signal $\overline{CS}$ at a node $\overline{Nb}$, processes of the inversion and delay of the signal CS, and supplies each of the above-mentioned circuits with the processed signal. In this case, the CS buffer 31 supplies the NOR gate 34 with a control signal Se via a node Ne, and supplies the ATC generating circuit 33 with a control signal Sf via a node Nf. The control signal Sf is generated after the generation of the control signal Se. The generation of the signals Se and Sf is dependent on whether or not the pulse width of the chip non-selection signal $\overline{CS}$ is shorter than a predetermined time period, which is equivalent to the time period required for resetting the potentials of the pair of bit lines connected to the memory cell array. If the pulse width of the signal $\overline{CS}$ is longer than the predetermined time period, a high level signal Se is generated and sent to the NOR gate 34, so that the address signal ADD or a change thereof is not transmitted to the address buffer 35. On the other hand, if the pulse width of the signal $\overline{CS}$ is shorter than the predetermined time period, a low level signal Se is generated and sent to the NOR gate 34, so that the address signal ADD or a change thereof can be transmitted to the address buffer 35. Note, the signal Se is hereinafter referred to as a first stage control signal. Also, the concrete constitution of the CS buffer 31 and each control signal thereof will be described later in detail.

The address signal ADD is applied to another input of the NOR gate 34, and the output of the NOR gate 34 is applied to the address buffer 35, which is connected to the ATC generating circuit 33 and decoder 37. The decoder 37, which decodes the address signal ADD input through the address buffer 35, is connected to the memory cell array 39, in which address access is effected. The CTC generating circuit 32 generates the clock CTC in response to the chip non-selection signal $\overline{CS}$ under the control of the CS buffer 31, and the ATC generating circuit 33 generates the clock ATC in response to the address signal ADD, also under the control of the CS buffer 31. The clock ATC is generated after the generation of the clock CTC. The concrete constitution of the CTC generating circuit 32 and ATC generating circuit 33 will be described later. The clocks CTC and ATC are applied to a gate circuit 38, which, by logically adding the clocks CTC and ATC, generates a reset signal $\phi$ for equalizing the potentials of the pair of complementary bit lines connected to each of the cells in the memory cell array 39.

Figure 4:
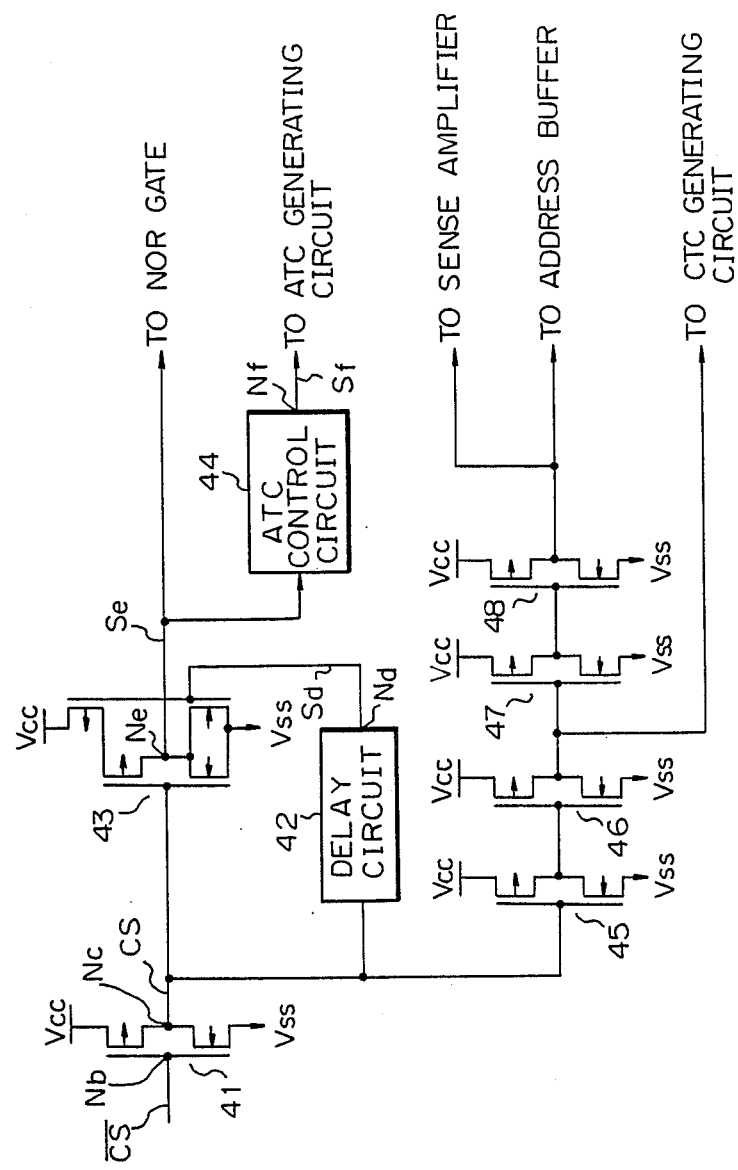
FIG. 4 is a circuit diagram illustrating a concrete example of the CS buffer shown in FIG. 3.

FIG. 4 illustrates a concrete example of the CS buffer 31 shown in FIG. 3. In FIG. 4, reference numerals 41, 45, 46, 47, and 48 denote CMOS inverters, each of which is constituted by a P-channel MOS transistor as a load connected to a higher power line Vcc and a N-channel MOS transistor as a driver connected to a lower power line Vss, and has the function of inverting a signal input with the signal delayed to a certain extent. Reference numeral 42 denotes a delay circuit, which, in response to the change, of the signal, i.e., the chip selection signal CS, at a node Nc on the output of the inverter 41, begins following at a predetermined delay time ta and stops following at another predetermined delay time tb, where tb is smaller than ta. The delay time ta is defined as a time period required for setting the memory cell array to the stand-by state, in other words, the time period required for resetting the potentials of the pair of bit lines connected to the memory cell array. Reference numeral 43 denotes a NOR gate which outputs the first stage control signal Se having a high level at the node Ne only when both the signal Sd at a node Nd on the output of the delay circuit 42 and the signal CS at the node Nc on the output of the inverter 41 are at a low level. Reference numeral 44 denotes an ATC control circuit, which outputs the control signal Sf at the node Nf according to whether or not the control signal Se at the node Ne is at a low level, and supplies the ATC generating circuit 33 with the control signal Sf. Namely, the ATC control circuit 44 has the function of controlling the ATC generating circuit 33 to supply the gate circuit 38 with the clock ATC when the signal Se at the node Ne is at a low level, and of controlling the ATC generating circuit 33 to prohibit the supply of the clock ATC to the gate circuit 38 when the signal Se is at a high level. The concrete constitution of the ATC control circuit 44 will be described later.

The signal CS at the node Nc is delayed by passing through two inverters 45 and 46, and is fed to the CTC generating circuit 32. Therefore, the clock CTC is generated with a predetermined delay time from the time at which the chip non-selection signal $\overline{CS}$ changes from high level to low level. This delay time is substantially equivalent to a time period in which the signal $\overline{CS}$ passes through three inverters 41, 45, and 46, and is hereinafter indicated by a reference tA. Also, the signal CS at the node Nc is delayed by passing through four inverters 45, 46, 47, and 48, and is fed to the address buffer 35 and sense amplifier 36. On the other hand, as shown in FIG. 3, the clock ATC is generated with a predetermined delay time from the time at which the address signal ADD changes. This delay time is substantially equivalent to a time period in which the signal ADD passes through the NOR gate 34 and address buffer 35, and is hereinafter indicated by a reference tB. The timing of the generation of the clock ATC and that of the clock CTC are offset from each other, and the former is always after the latter. Accordingly, when the signal Se at the node Ne is at a low level, i.e., when the pulse width of the chip non-selection signal $\overline{CS}$ is shorter than the predetermined time period ta, the clock ATC is added to the clock CTC, so that the pulse width of the reset signal $\phi$ becomes longer than when only the clock CTC is input to the gate circuit 38. Conversely, when the signal Se is at a high level, i.e., when the pulse width of the signal $\overline{CS}$ is longer than the predetermined time period ta, the clock ATC is not generated, so that the pulse width of the reset signal $\phi$ becomes the same as that of the clock CTC. Namely, the reset signal $\phi$ is generated, depending upon the length of the pulse width of the chip non-selection signal $\overline{CS}$.

When the signal Se at the input of the NOR gate 34 is at a low level, in other words, when the CS first stage control from the CS buffer 31 is not effected, the address signal ADD or the change thereof can be transmitted via the NOR gate 34 to the address buffer 35. As described before, the CS first stage control is a measure taken for decreasing the currents dissipated during the stand-by period of the memory cell. As shown in FIG. 3, when the signal Se is at a high level, i.e., when the CS first stage control is effected, the NOR gate 34 maintains the low level output irrespective of the change of the address signal ADD. As a result, the internal circuit including the address buffer 35, the decoder 37, and the memory cell array 39 cannot operate, and the current dissipation can be decreased.

Figure 5:
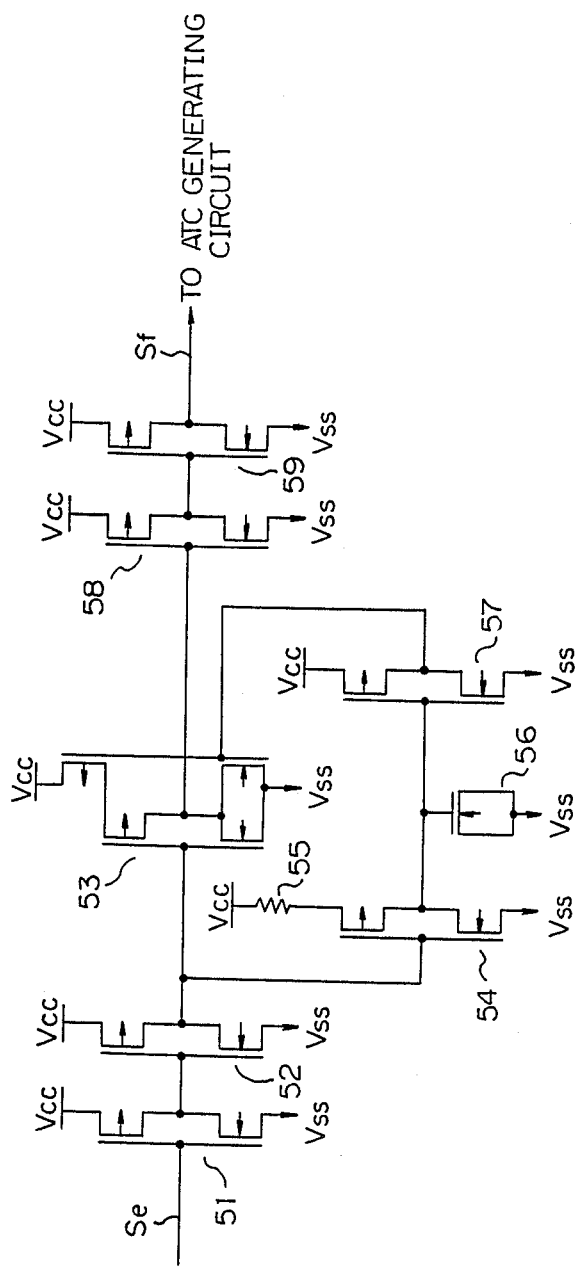
FIG. 5 is a circuit diagram illustrating a concrete example of the ATC control circuit shown in FIG. 4.

FIG. 5 illustrates a concrete example of the ATC control circuit 44 shown in FIG. 4. In FIG. 5, reference numerals 51, 52, 54, 57, 58, and 59 denote CMOS inverters, each of which is constituted by a P-channel MOS transistor as a load connected to a higher power line Vcc and an N-channel MOS transistor as a driver connected to a lower power line Vss, and inverts a signal input with the signal delayed to a certain extent. Referring to the CMOS inverter 54, the P-channel MOS transistor is connected via a resistor 55 to the power line Vcc. Reference numeral 56 denotes a MOS capacitor, which is connected between the two inverters 54 and 57; elements 54, 55, 56, and 57 constitute a delay circuit; and reference numeral 53 denotes a NOR gate constituted by two CMOS inverters. The signal Se is applied to the input of one CMOS inverter via the inverters 51 and 52, and the signal Se is applied to the input of another CMOS inverter via the inverters 51, 52, 54, and 57. The NOR gate 53 outputs the high level signal only when both of the inputs are at a low level. The output of the NOR gate 53 is sent, via the inverters 58 and 59, to the ATC generating circuit 33. Accordingly, the ATC control circuit 44 has the function of delaying the change of the signal Se and generating the signal Sf as the delayed signal.

Figure 6:
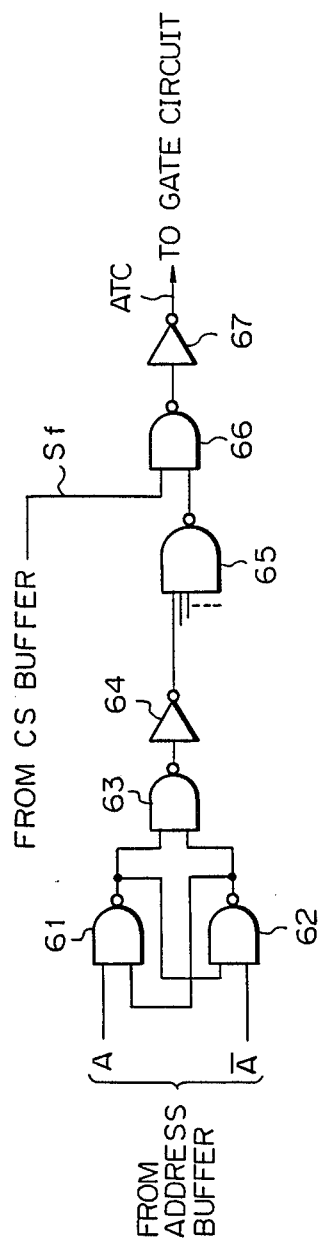
FIG. 6 is a circuit diagram illustrating a concrete example of the ATC generating circuit shown in FIG. 3.

FIG. 6 illustrates a concrete example of the ATC generating circuit 33 shown in FIG. 3. In FIG. 6, references A and $\overline{A}$ denote a signal corresponding to one bit of a plurality of bits constituting the address signal, which is transmitted from the address buffer 35. One of the address bit signals is input to a NAND gate 61, and the other is input to a NAND gate 62. The NAND gates 61 and 62 constitute a flip-flip, the output of which is input to a NAND gate 63. The output of the NAND gate 63 is applied via an inverter 64 to one of the inputs of a NAND gate 65, and the address bits of the rest of the address signal are applied to other inputs of the gate 65. The output of the NAND gate 65 is applied to one of the inputs of a NAND gate 66, and the signal Sf from the CS buffer 31 is applied to another input of the gate 66. The output of the NAND gate 66 is applied to an inverter 67, from which the clock ATC is transmitted to the gate circuit 38. Each of the elements 61 and 67 is constituted by a plurality of MOS transistors and is known. Accordingly, the ATC generating circuit 33 has the function of generating the clock ATC with a predetermined delay time from the time at which the address signal changes, according to whether or not the control signal Sf is at a low level. This delay time is defined by tB, as described above.

Figure 7:
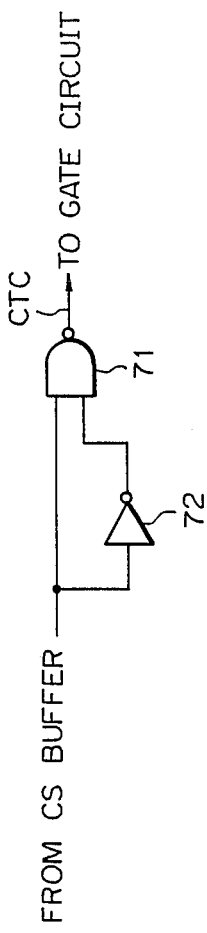
FIG. 7 is a circuit diagram illustrating a concrete example of the CTC generating circuit shown in FIG. 3.

FIG. 7 illustrates a concrete example of the CTC generating circuit 32 shown in FIG. 3. In FIG. 7, the delayed chip non-selection signal from the CS buffer 31 is applied to one of the inputs of a NAND gate 71. This chip non-selection signal is also applied via an inverter 72 to another input of the NAND gate 71, and the output from the gate 71, i.e., the clock CTC, is transmitted to the gate circuit 38. Each of the elements 71 and 72 is constituted by a plurality of MOS transistors and is known. Accordingly, the CTC generating circuit 32 has the function of adding a further delay to the delayed signal from the CS buffer 31. That is, the clock CTC is generated with a predetermined delay time from the time at which the chip non-selection signal $\overline{CS}$ changes from high level to low level. This delay time is defined by tA, as described above.

FIGS. 8a to 8i and 9a to 9i illustrates operational waveforms of each portion in the device shown in FIG. 3. FIGS. 8a to 8i correspond to the case wherein the pulse width of the chip non-selection signal $\overline{CS}$ is shorter than the predetermined time period ta, i.e., when a CS first stage control is not effected. FIGS. 9a to 9i correspond to the case wherein the pulse width of the signal $\overline{CS}$ is longer than the predetermined time period ta, i.e., when a CS first stage control is effected. The above-mentioned predetermined time period ta is defined as the time period required for resetting the potentials of the pair of bit lines connected to each cell in the memory cell array, as described above.

Referring to FIGS. 8a to 8i, the signal Se at the mode Ne, i.e., the first stage control signal Se, is at a low level due to the short pulse width signal $\overline{CS}$. In response to the low level signal, the ATC control circuit 44 causes the ATC generating circuit 33 to supply the gate circuit 38 with the clock ATC. The timing of the generation of the clock ATC is offset from that of the clock CTC generated by the CTC generating circuit 32. Accordingly, the output signal of the gate circuit 38, i.e., the reset signal $\phi$, has a pulse width longer by the logical addition of the clocks CTC and ATC. As is described above, when the pulse width of the signal $\overline{CS}$ is short, it takes a long time for the memory cell to reach the standby state, resulting in a delay in access. However, according to the present example, the pulse width of the reset signal $\phi$ becomes longer, so that the potentials of the pair of bit lines can be reliably reset, resulting in a reduction of the access time.

Also, in the case shown in FIGS. 8a to 8i, the NOR gate 34 is open due to the low level signal Se. Namely, the delay due to the first stage control within the CS buffer 31 is absent, so that a further delay of the access is not required.

Next, referring to FIGS. 9a to 9i, the first stage control signal Se is at a high level due to the long pulse width signal $\overline{CS}$. In response to the high level signal, the ATC control circuit 44 controls the ATC generating circuit 33 to prohibit the supply of the clock ATC to the gate circuit 38. Accordingly, only the clock CTC is input to the gate circuit 38 and the clock CTC per se represents the reset signal $\phi$. In this case, since the pulse width of the signal $\overline{CS}$ is at a full length, only a short time is needed for the memory cell to reach the stand-by state. Therefore, even the short pulse width reset signal $\phi$ as shown in FIG. 9i can reliably reset the potentials of the pair of bit lines connected to each memory cell. Also, since the pulse width of the reset signal $\phi$ becomes shorter, compared to the case shown in FIG. 8i, the access operation can be quickly carried out.

Also, in the case shown in FIGS. 9a to 9i, the NOR gate 34 is closed due to the high level signal Se. Accordingly, the address signal ADD or a change thereof is not transmitted to the internal circuit subsequent to the address buffer 35, and thus the power dissipation in the internal circuit can be decreased. Although a delay occurs due to the first stage control within the CS buffer 31, the next CS access operation can be carried out more quickly than the address access, assuming that the address access is to be carried out, because the pulse width of the chip non-selection signal $\overline{CS}$ is at a full length and the memory cell is brought to the stand-by state and prepared for access, based on the reliable resetting of the potentials of the pair of bit lines. Therefore, the delay due to the first stage control does not affect the access operation of the device as a whole.

Although the present invention has been disclosed and described by way of only one embodiment, it is apparent to those skilled in the art that other embodiments and modifications of the present invention are possible without departing from the spirit or essential features thereof.

What is claimed is:

1. A semiconductor memory device having a chip selection state and a chip non-selection state having a pulse width defined with respect to a predetermined time period and receiving an address signal and a chip selection signal, said device comprising:
   a pair of signal lines for transferring a complementary signal;
   reset means, operatively connected between said signal lines, for equalizing potentials of said signal lines in response to a reset signal;
   a first clock generating circuit, connected to receive the chip selection signal, for generating a first clock signal in response to a transition of the chip selection signal, the transition being from the chip non-selection state to the chip selection state;
   a second clock generating circuit, connected to receive the address signal, for generating a second clock signal in response to a transition of the address signal, the second clock signal being generated during a generation of the first clock signal and terminated at a predetermined time period after the generation of the first clock signal is terminated;
   a logical OR circuit, connected to said first and second clock generating circuits, for receiving the first and second clock signals and outputting the reset signal; and
   a control circuit, operatively connected to said second clock generating circuit, for permitting the generation of the second clock signal when a pulse width, corresponding to a time period of the chip non-selection state, of the chip selection signal is shorter than a predetermined time period.

2. A device as set forth in claim 1, wherein said control circuit controls said second clock generating circuit to prohibit the generation of the second clock signal when the time period of the chip non-selection state is longer than the predetermined time period.

3. A device as set forth in claim 1, wherein the generation of the first clock signal is delayed from a time at which the level of the chip selection signal is inverted to change from a non-selection of the second clock signal is delayed from a time which the address signal is changed.

4. A device as set forth in claim 2, wherein said logical OR circuit outputs the first clock signal as the reset signal when the time period of the chip non-selection state is longer than the predetermined time period.

5. A device as set forth in claim 1, wherein said logic OR circuit outputs a clock signal having a longer pulse width than the first clock signal as the reset signal when the time period of the chip non-selection state is shorter than the predetermined time period.

6. A device as set forth in claim 1, further comprising an input stage, operatively connected to said control circuit and second clock generating circuit, for receiving the address signal and transmitting the address signal to said second clock generating circuit.

7. A device as set forth in claim 5, wherein said control circuit disables said input stage when the time period of said chip non-selection state is larger than the predetermined time period, thereby prohibiting the generation of the second clock signal.

8. A device as set forth in claim 5, wherein said control circuit enables said input stage when the time period of the chip non-selection state is shorter than the predetermined time period, thereby permitting the generation of the second clock signal.

* * * * *

UNITED STATES PATENT AND TRADEMARK OFFICE
CERTIFICATE OF CORRECTION

PATENT NO. : 4,800,552
DATED : JANUARY 24, 1989
INVENTOR(S) : ATUO KOSHIZUKA ET AL.

It is certified that error appears in the above-identified patent and that said Letters Patent is hereby corrected as shown below:

Col. 3, line 61, "CS" should be --$\overline{CS}$--.

Col. 4, line 30, "$\overline{Nb}$," should be --Nb,--;

line 31, "CS," should be --$\overline{CS}$,--.

Col. 9, line 4, "selection of" should be --selection state, and the generation of--;

line 5, "time which" should be --time at which--;

line 12, "logic" should be --logical--.

Signed and Sealed this

Sixth Day of June, 1989

Attest:

DONALD J. QUIGG

Attesting Officer

Commissioner of Patents and Trademarks